United States Patent [19]

Ito

[11] Patent Number: 5,089,935
[45] Date of Patent: Feb. 18, 1992

[54] CONTROL DEVICE CASE
[75] Inventor: Eiji Ito, Aichi, Japan
[73] Assignee: Mitsubishi Denki Kabushiki Kaisha, Tokyo, Japan
[21] Appl. No.: 578,243
[22] Filed: Sep. 6, 1990
[30] Foreign Application Priority Data Feb. 28, 1990 [JP] Japan .................. 2-47880

[51] Int. Cl.$^5$ .................................. H05K 7/20
[52] U.S. Cl. ........................... 361/383; 361/386; 361/399
[58] Field of Search ............. 361/383, 384, 386, 392, 361/394, 395, 399, 415

[56] References Cited

U.S. PATENT DOCUMENTS

| | | |
|---|---|---|
| 4,525,769 | 6/1985 | Lehmann . |
| 4,620,263 | 10/1986 | Ito .................. 361/383 |
| 4,953,058 | 8/1990 | Harris .................. 361/383 |
| 4,956,750 | 9/1990 | Maggelet .................. 361/383 |
| 4,985,803 | 1/1991 | Pum et al. .................. 361/383 |

FOREIGN PATENT DOCUMENTS

| | | |
|---|---|---|
| 0239322 | 9/1987 | European Pat. Off. . |
| 55-176565 | 1/1975 | Japan . |
| 1511952 | 5/1978 | United Kingdom . |

Primary Examiner—Gregory D. Thompson
Attorney, Agent, or Firm—Burns, Doane, Swecker & Mathis

[57] ABSTRACT

A control device case is disclosed which is comparatively small in size and is safe and easy to operate. The control device case includes a case body in the form of a rectangular hollow pipe having a substantially rectangular cross section. The case body has a printed circuit board holding structure formed on an inner periphery thereof for holding a printed circuit board on which an element which may generate heat is mounted. The case body has a plurality of cooling fins formed in an axial direction of the pipe on an outer periphery thereof for radiating heat generated from the element on the printed circuit board. The opposite ends of the case body in the axial direction are formed such that the length of a first wall of the case body is shorter than the opposing second wall of the case body. A pair of covers are mounted on the opposite end portions of the case body in such a manner as to cover over the opposite ends of the case body in the axial direction and each has an opening formed therein such that a member mounted on the printed board may be manually operated therethrough. The covers may be interconnected into a single cover.

11 Claims, 8 Drawing Sheets

CONTROL DEVICE CASE

BACKGROUND OF THE INVENTION

1. Field of the Invention

This invention relates to a control device case for use with a control device of a comparatively small size such as an invertor device.

2. Description of the Prior Art

Control devices such as invertor devices for controlling a motor of a comparatively small capacity frequently employ a case of the type wherein a heat generating element such as a semiconductor module element is secured directly to a case body on which cooling fins are formed so that the case may also serve as a cooler for cooling the heat generating element of the control device.

One of such control device case is disclosed, for example, in Japanese Utility Model Laid-Open No. 176565/1980 and is shown in FIGS. 9 and 10. Referring to FIGS. 9 and 10, the control device case includes a case body 1 having a base wall 1c. A plurality of cooling fins 1a in the form of vertical ribs are formed on a rear face of the base wall 1c of the case body 1 while a pair of cooling fins 1b in the form of vertical ribs are formed on a front face of the base wall 1c. The cooling fins 1b serve also as the opposite side walls of the body 1. A pair of shoulders or steps 1d are formed on the front side of the base wall 1c, and a prepared hole groove 1e is formed in each step 1d. Such a prepared hole groove 1e is formed also along a front end of each of the cooling fins 1b. A printed circuit board 2 is placed on the steps 1d of the base wall 1c of the case body 1 and is secured to the latter by means of a plurality of self-tapping screws 6 screwed into the prepared hole grooves 1e on the steps 1d. Several electric or electronic parts are mounted on the printed circuit board 2. For example, a pair of terminal blocks 3 are mounted at upper and lower portions of a front face of the printed circuit board 2 while a pair of semiconductor module elements 4 such as power transistors which generate heat when energized are mounted on a rear face of the printed circuit board 2. The control device case further includes a cover 5 secured to the case body 1 by means of another plurality of self-tapping screws 6 screwed into the prepared hole grooves 1e at the front ends of the cooling fins 1b. The printed circuit board 2 is thus confined in a spacing defined by the case body 1 and the cover 5.

The case body 1 is produced by cutting an extrusion molded material or bar of aluminum which has such a cut end as shown as a section of the case body 1 in FIG. 10. The prepared hole grooves 1e on the steps 1d and cooling fins 1b are formed upon such extrusion molding of aluminum.

When the control device is to be actually used, that is, if connecting lines (not shown) to a power source and a motor (not shown) which is to be controlled by the control device are connected to the terminal blocks 3 in order to control the motor, the semiconductor module elements 4 and some other heat generating members are energized to generate heat. The heat thus generated is transmitted to the case body 1 and then radiated from the cooling fins 1a and 1b of the case body 1 to the external air. Thus, the larger the capacity of the motor, the more heat which is generated by the heat generating members, and accordingly, the larger the total heat radiating area of the cooling fins 1a and 1b must be made. This factor necessairly increases the size of the case body 1.

Also, with the structure shown in FIGS. 9 and 10, the cover 5 must be removed before the connecting lines (not shown) to the terminal blocks 3 are connected. Also, it is difficult to form mounting legs by way of which the case body 1 is to be secured to a wall (not shown) of a room or the like.

Also, since the case body 1 is made of aluminum, which is high in heat conductivity, an operator inadvertently touching with the case body 1 may be burnt by the case body 1 due to heat generated by the heat generating members.

Since the conventional control device case is constructed in such a manner as described above, it is disadvantageous in that the size of the control device case must be made comparatively large with respect to heat generation by the semiconductor elements built therein as the capacity of an object which is to be controlled increases. Also, operation of a member such as a terminal block mounted on the printed circuit board and formation of an opening through which wires to the terminal block are threaded are difficult. Further, where the case body of the control device case is made of a metal, it is a drawback that an operator may inadvertently touch and be burned by the case body which is in a comparatively high temperature condition due to generation of heat from the semiconductor elements.

SUMMARY OF THE INVENTION

It is an object of the present invention to provide a control device case which is comparatively small in size and is safe and easy to operate.

In order to attain the object, according to an aspect of the present invention, there is provided a control device case which includes a case body in the form of a rectangular hollow pipe having a substantially rectangular cross section wherein, the case body has a printed circuit board holding structure formed on an inner periphery thereof for holding a printed circuit board on which an element which may generate heat is mounted. The case body has a plurality of cooling fins formed in an axial direction of the case body on an outer periphery thereof for radiating heat generated from the element on the printed circuit board held on the printed circuit board holding structure of the case body. Opposite ends of the case body in the axial direction are formed such that the length of a first wall of an case body is shorter than the opposing second wall of the case body. A pair of covers are mounted on opposite end portions of the case body in such a manner as to cover over the opposite ends of the case body in the axial direction, wherein each of the covers have an opening formed therein such that a member mounted on the printed board may be manually operated therethrough.

With the control device case, heat generated from the element on the printed circuit board held on the printed circuit board holding structure of the case body is radiated to the external air directly from the cooling fins formed on the outer periphery of the case body. Accordingly, the control device case is superior in heat radiating property, and a control device in which the control device case is incorporated can have a comparatively great capacity with a comparatively small size. Further, the opposite end portions of the printed circuit board are exposed from the opposite ends of the case body, and consequently, a member mounted at either of the end portions of the printed circuit board can be manually operated through the opening of the corresponding cover without the necessity of removing the cover. Accordingly, the control device case is also superior in operability.

According to another aspect of the present invention, there is provided a control device case which comprises a case body in the form of a rectangular hollow pipe having a substantially rectangular cross section, wherein the case body has a printed circuit board holding structure formed on an inner periphery thereof for holding a printed circuit board on which an element which may generate heat is mounted. The case body has a plurality of cooling fins formed in an axial direction of the case body on an outer periphery thereof for radiating heat generated from the element on the printed circuit board held on the printed circuit board holding structure of the case body. Opposite ends of the case body in the axial direction are formed such that the length of a first wall of the case body is shorter than an opposing second wall of the case body. A cover for covering over the first wall, other opposing walls and the opposite ends of the case body, is provided, wherein the cover has an opening formed in a front wall thereof such that a member mounted on the printed board may be manually operated therethrough. The cover has a plurality of ventilating holes formed in opposite end portions thereof in the axial direction for passing air into and out of a spacing defined by the case body and cover.

With the control device case, heat generated from the element on the printed circuit board held on the printed circuit board holding structure of the case body is radiated to the external air directly from the cooling fins on the second wall of the case body and indirectly from the cooling fins formed on the other walls of the case body by way of air which is communicated with the outside of the control device case by way of the ventilating holes formed in the cover. Accordingly, the control device case is superior in heat radiating property, and a control device in which the control device case is incorporated can have a comparatively great capacity with a comparatively small size. Further, the opposite end portions of the printed circuit board are exposed from the opposite ends of the case body, and consequently, a member mounted at either of the end portions of the printed circuit board can be manually operated through the opening of the cover without the necessity of removing the cover. Accordingly, the control device case is also superior in operability. Further, since the case body is covered with the cover except at a second wall where the case body is attached to a suitable support such as a wall of a room, there is no possibility that an operator may inadvertently touch and be burnt by the case body.

The above and other objects, features and advantages of the present invention will become apparent from the following description and the appended claims. taken in conjunction with the accompanying drawings in which like parts are denoted by like reference characters all through the drawings.

DESCRIPTION OF THE PREFERRED EMBODIMENTS

Figure 1A:
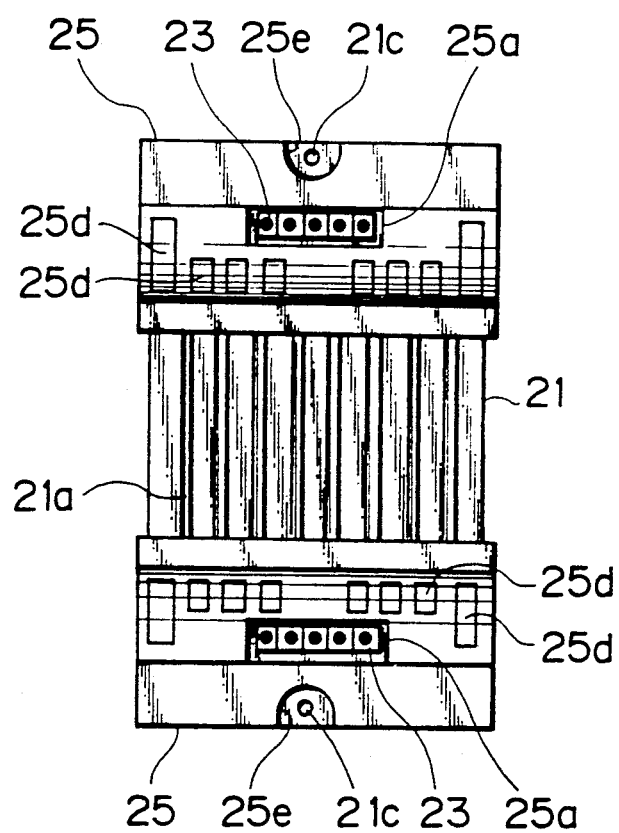
FIGS. 1a and 1b are a front elevational view and a side elevational view, respectively, of a control device case showing a preferred embodiment of the present invention.
Figure 1B:
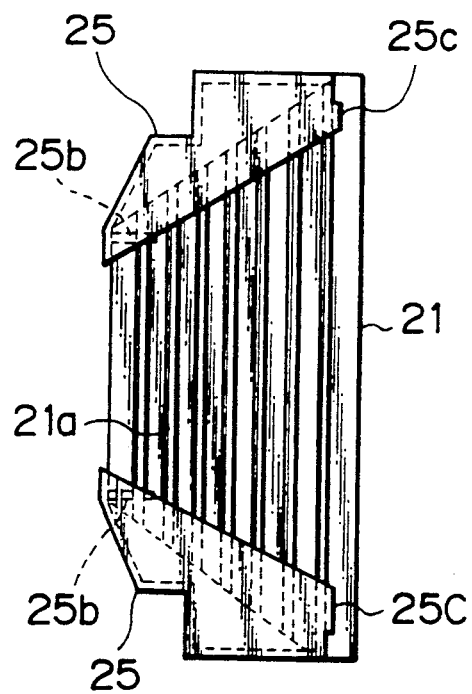
Figure 2A:
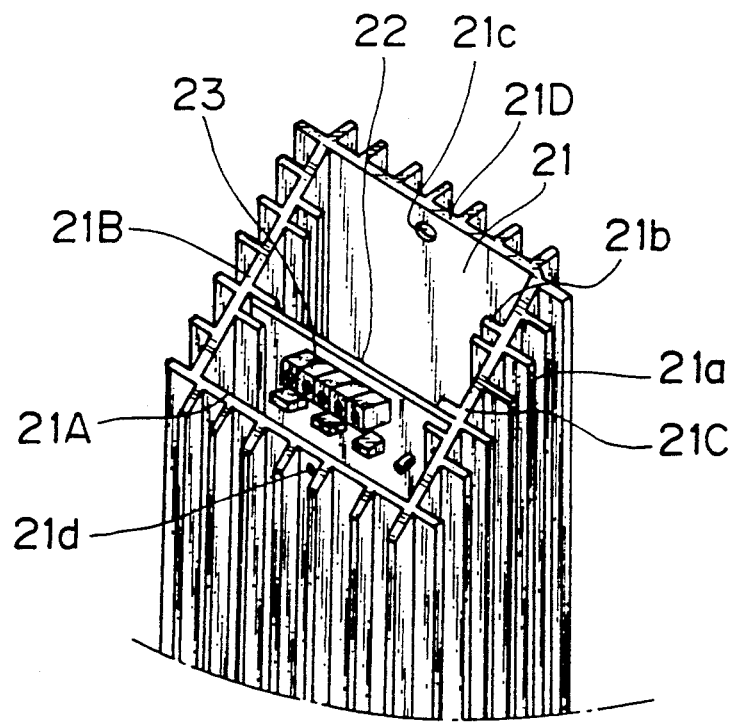
FIGS. 2a and 2b are perspective views of a case body and a cover, respectively, of the control device case shown in FIGS. 1a and 1b.
Figure 2B:
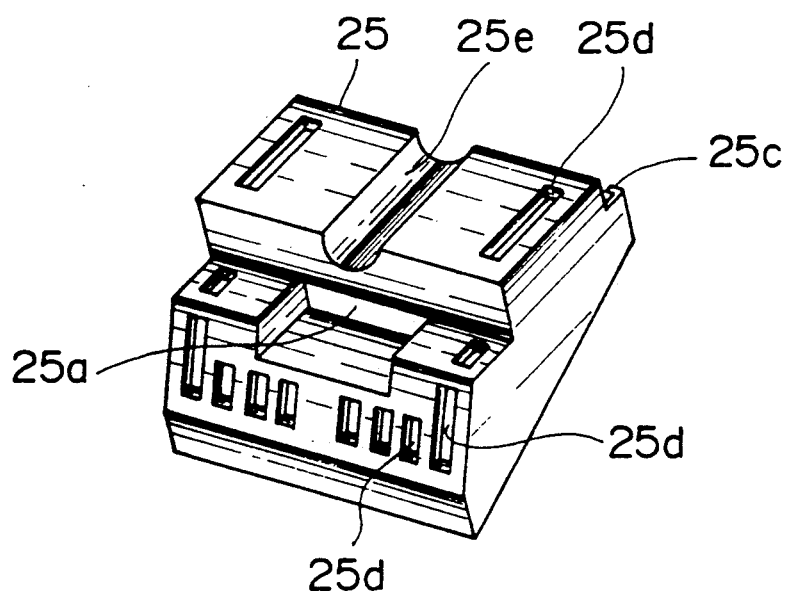
Figure 3:
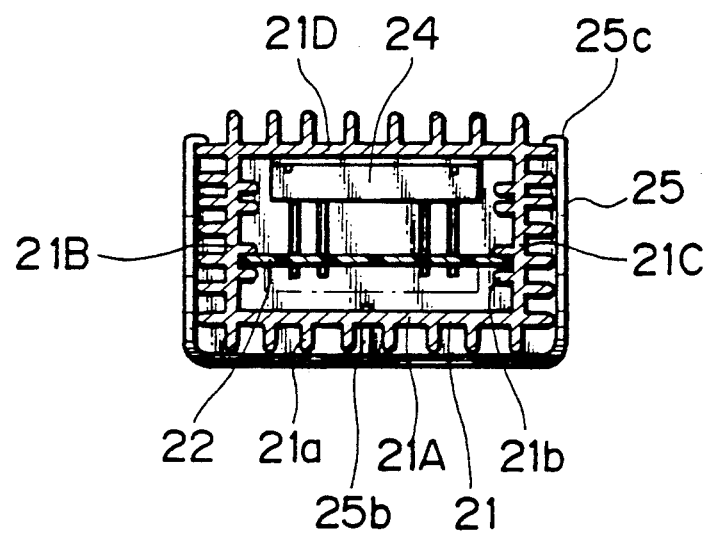
FIGS. 3 and 4 are a horizontal sectional view and a vertical sectional view, respectively, of the control device case shown in FIGS. 1a and 1b.

Referring first to FIGS. 1a to 4, there is shown a control device case of the present invention. The control device case shown includes a case body 21 in the form of a rectangular pipe having a cross section of a generally rectangular shape as seen in FIG. 3. A large number of vertical cooling fins 21a in the form of ribs are formed on an outer periphery, that is, outer faces of a front wall 21A, the opposite side walls 21B and 21C and a rear wall 21D, of the case body 21. Four pairs of vertical cooling ribs 21b are formed in parallel to each other at opposing locations of inner faces of the opposite side walls 21B and 21C of the case body 21 as shown in FIGS. 2a and 3. The case body 21 is produced by cutting an extrusion molded rectangular pipe of aluminum which has a cross-section shown in FIG. 3. Thus, the outer cooling fins 21a and inner cooling fins 21b are formed in parallel to an axis of the rectangular pipe.

Figure 4:
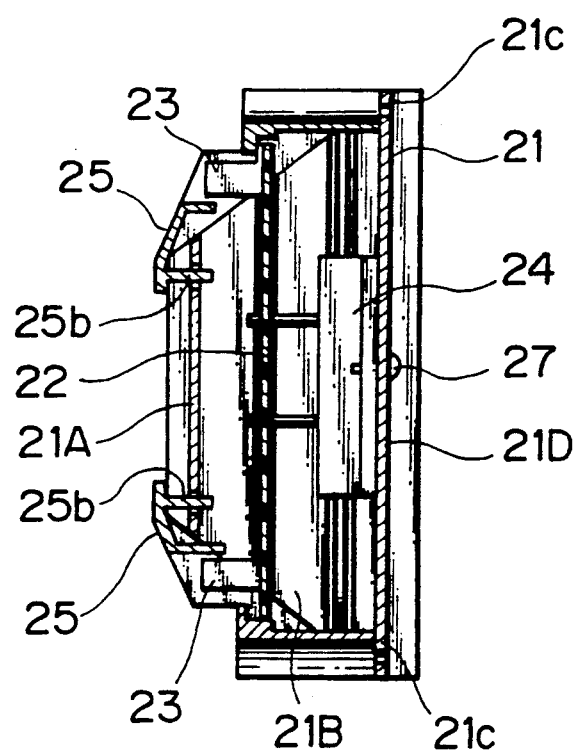

The opposite ends of the case body 21 in the direction of the pipe axis, that is, cut ends of the rectangular pipe, are inclined such that the length in the direction of the pipe axis is smaller at the front wall 21A than at the rear wall 21D of the pipe as seen in FIGS. 1b and 4. A securing hole 21c for a screw (not shown) or the like for securing the case body 1 to a wall (not shown) of a room or the like is formed at each of upper and lower locations of the rear wall 21D of the case body 21, and a hole 21d for another screw for securing a cover 25 which will be hereinafter described to the case body 21 is formed at each of upper and lower locations of the front wall 21A of the case body 21 as shown in FIGS. 2a and 4.

Referring to FIGS. 2a, 3 and 4, a printed circuit board 22 is held between two opposing pairs of the inner ribs 21b on the opposing inner faces of the side walls 21B and 21C of the case body 21, and a pair of terminal blocks 23 are mounted at upper and lower locations of a front face of the printed circuit board 22 such that they are exposed from the opposite inclined ends of the case body 21.

Referring to FIGS. 3 and 4, though not particularly shown, several other electric or electronic elements are mounted on the printed circuit board 22 and include, for example, a semiconductor module 24 which is mounted on a rear face of the printed board 22 such that a heat radiating portion thereof may closely contact with the case body 1.

Referring to FIGS. 2b, 3 and 4, the control device case further includes a pair of covers 25 in the form of molded plastic articles for covering the opposite inclined ends of the case body 21. Each of the covers 25 has an angular hole 25a formed at a central portion thereof such that a corresponding one of the terminal blocks 23 mounted on the printed board 22 can pass therethrough. Each of the covers 25 further has a projection 25b formed on an inner face thereof such that it may be engaged with a corresponding one of the holes 21d formed in the case body 21 to prevent the cover 25 from coming off of the case body 21. Each of the covers 25 further has a pair of hooks 25c formed at rear ends of the opposite left and right ends thereof, such that they may be engaged with rear faces of the rearmost ones of the cooling ribs 21a on the opposite side walls 21B and 21C of the case body 21 to arrest the cover 25 in position on the case body 21. Each of the covers 25 further has a plurality of angular ventilating holes 25d formed at front and top walls thereof. Each of the covers 25 additionally has a recessed portion 25e formed thereon in an aligned relationship with a corresponding one of the securing holes 21c of the case body 21 as seen in FIG. 1a in order to facilitate a mounting operation of the control device case which involves placing a fastening member such as a fastening screw through the securing hole 21c.

The covers 25 are assembled to the opposite ends of the case body 21 in such a manner as seen in FIGS. 1a, 1b and 4. As particularly seen from FIGS. 1a and 4, each of the terminal blocks 23 mounted at the upper and lower portions of the printed circuit board 22 is exposed outside, that is, can be seen from the outside, through a corresponding one of the angular holes 25a of the covers 25.

In assembling such control device case as described above, a printed board 22 is first inserted between two opposing pairs of the inner cooling ribs 21b of a case body 21. Then, a semiconductor module 24 mounted on the printed circuit board 22 is secured to the rear wall 21D of the case body 21 from the rear of the case body 21 by means of a screw 27 or the like. Then, a pair of covers 25 are mounted onto the opposite axial ends of the case body 21. In particular, each of the covers 25 is moved toward the case body 21 in a direction perpendicular to the pipe axis from the front side under the guidance of the angular hole 25a thereof and a cooperating one of the terminal blocks 23 on the printed board 22, until the projection 25b thereof is engaged with the corresponding hole 21d formed in the front wall 21A of the case body 21. Then, the hooks 25c of the cover 25 are snap engaged with the rearmost cooling fins 21a on the opposite side walls 21B and 21C of the case body 21, thereby completing mounting of the cover 25 onto the case body 21.

The control device case assembled in this manner may be secured to a wall (not shown) of a room or the like using a screw or some other suitable means making use of the hole or holes 21c formed in the rear wall 21D of the case body 21.

With the control device case described above, when an object being controlled is rendered operative, heat is generated from the semiconductor module 24 and other heat generating elements on the printed circuit board 22. The heat thus generated is radiated from the entire surface of the case body 21 so that the semiconductor module 24 may function in a regular condition. Meanwhile, after the printed board 22 is inserted into the case body 21 but before the covers 25 are mounted onto the case body 21, the opposite end portions of the printed board 22 can be observed from the front side of the case body 21 because the opposite ends of the case body 21 are inclined. Accordingly, the terminal blocks 23, adjusting parts, display parts and other component that are not shown so forth are disposed at the opposite end portions of the printed board 22 so that they can be observed or operated from the outside. Consequently, the printed board 22 can be checked and adjusted without forming a special hole or holes in any of the cooling fins of the case body 21.

Figure 9:
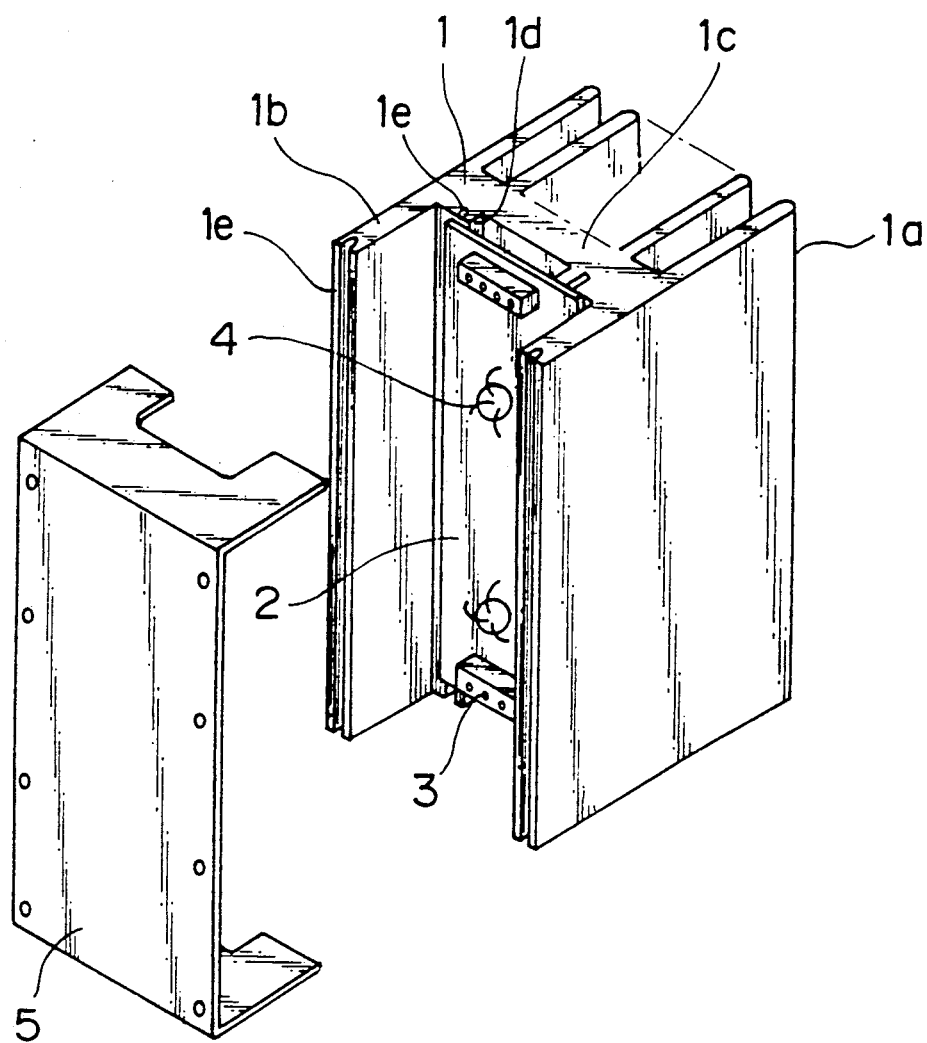
FIG. 9 is an exploded perspective view showing a case body and a cover of a conventional control device case.
Figure 10:
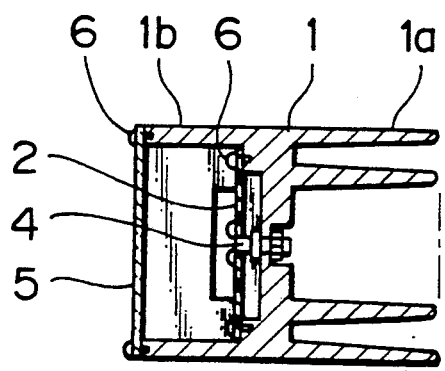
FIG. 10 is a horizontal sectional view of the control device case shown in FIG. 9.

The control device case of the present embodiment is characterized in that the heat radiating surface area with respect to the volume of the case body 21 can be made great comparing with that of a conventional control device case such as shown in FIGS. 9 and 10, due to the fact that the case body 21 is produced from an angular pipe produced by extrusion molding of aluminum. Therefore, the heat radiating fins 21a are provided on the four walls (front wall 21A, opposite side walls 21B and 21C and rear wall 21D) of the outer periphery of the case body 21. Thus, while in the conventional arrangement the front side of the case body is covered with cover, in the present embodiment the fins in the form of ribs are provided also on the front wall 21D which is part of the case body 21. The reason why the front wall 21D can be made part of the case body 21 is that the opposite ends (upper and lower ends) of the case body 21 in the direction of the pipe axis are cut obliquely. In particular, since the opposite ends of the case body 21 are inclined such that the front wall 21A of the case body 21 in the direction of the pipe axis may be shorter that the rear face 21D, the opposite end portions of the printed circuit board 22 held between the inner cooling fins 21b of the case body 21 can be exposed outside, and the terminal blocks 23, adjusting parts, display parts and so forth are mounted at those portions so that monitoring or operation may be performed readily from the outside.

Since the opposite ends of the case body 21 are cut obliquely, a molded aluminum material can be utilized effectively without yielding a scrap, and a possible danger which may arise from the fact that the edges of the obliquely cut faces make acute angles is eliminated by mounting on the opposite ends of the case body 21 the covers 25 of molded plastic articles of a thermal insulator. Further, since the opposite ends of the case body 21 are cut obliquely, the printed circuit board 22 can be secured readily to the case body 21 and a wiring operation to the terminal blocks 23 can be performed with safety. Also, securing of the control device to a wall of a room or the like can be achieved readily due to provision of the mounting holes 23c in the case body 21.

Figure 5A:
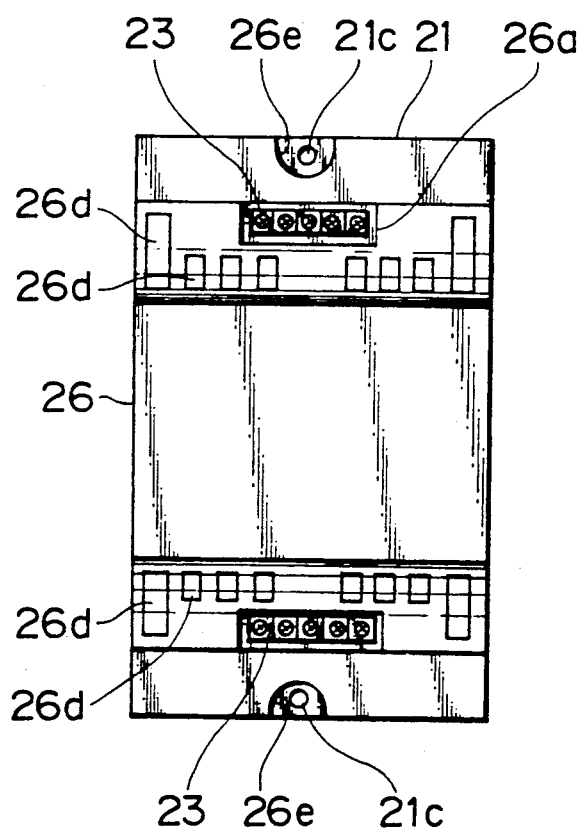
FIGS. 5a and 5b are a front elevational view and a side elevational view, respectively of a control device case showing another preferred embodiment of the present invention.
Figure 5B:
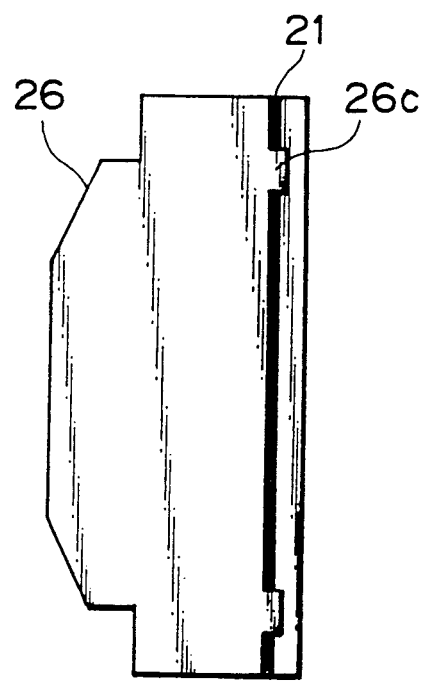
Figure 6A:
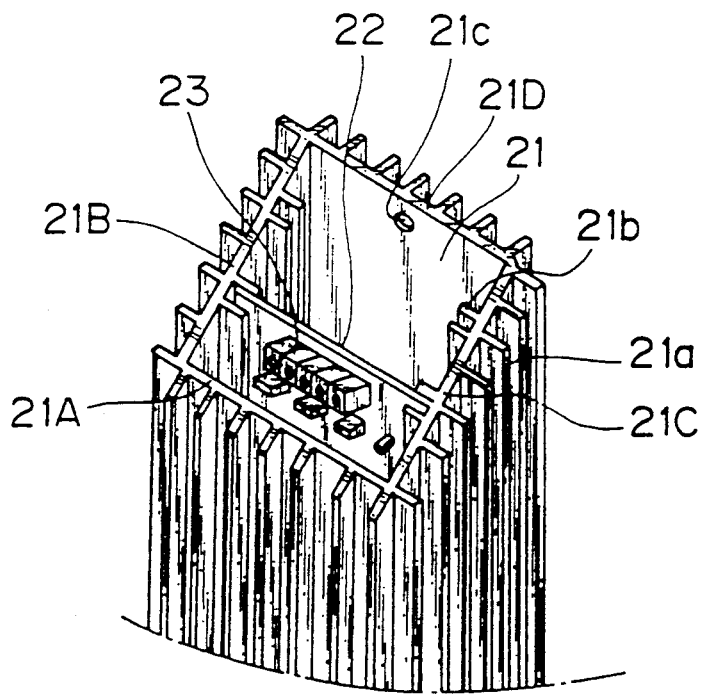
FIGS. 6a and 6b are perspective views of a case body and a cover, respectively, of the control device case shown in FIGS. 5a and 5b.
Figure 6B:
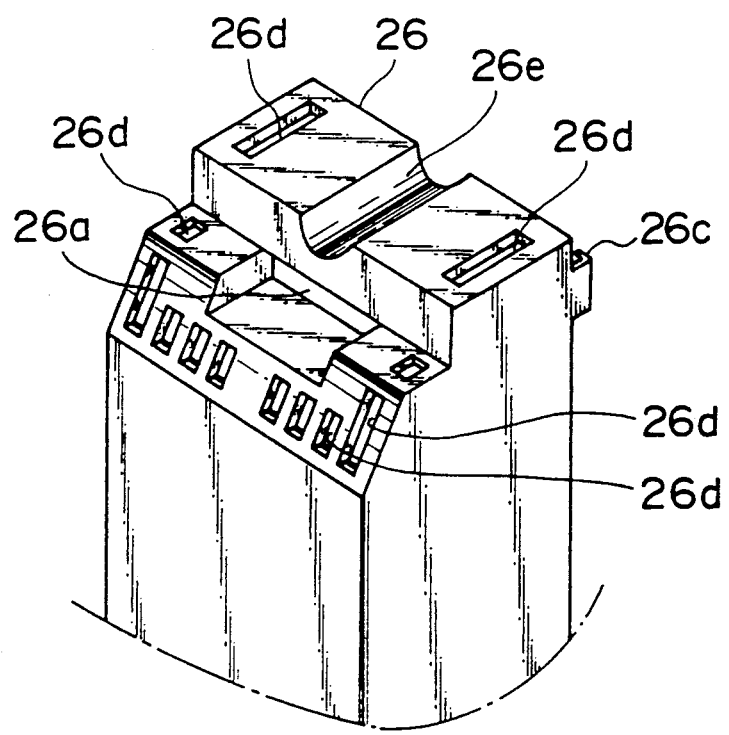
Figure 7:
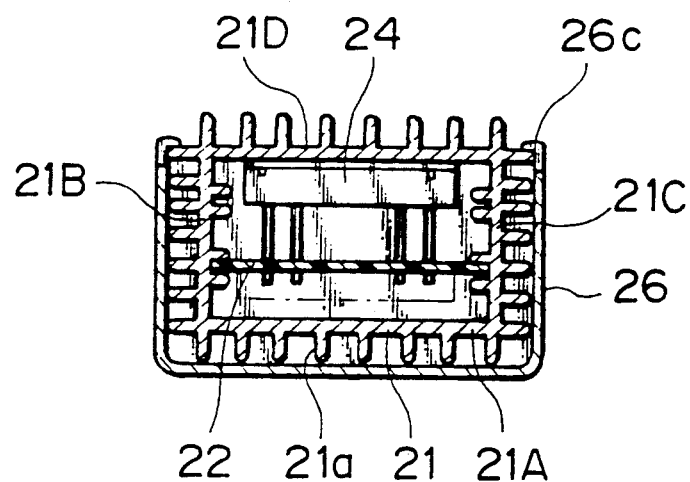
FIGS. 7 and 8 are a horizontal sectional view and a vertical sectional view, respectively, of the control device case shown in FIGS. 5a and 5b.
Figure 8:
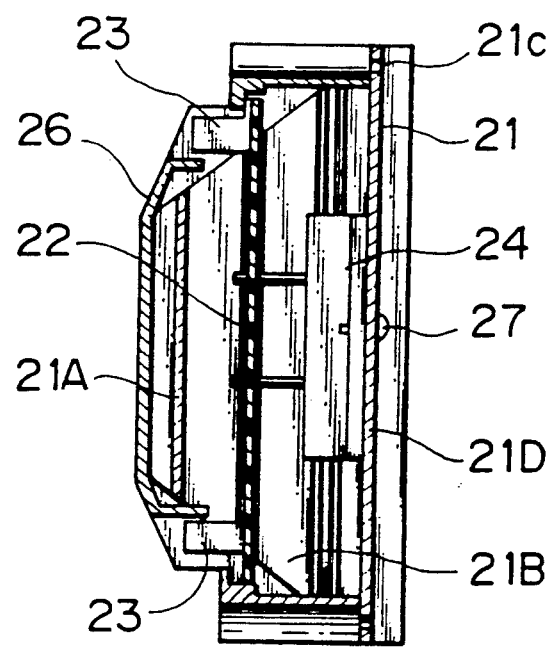

Referring now to FIGS. 5a to 8, there is shown another control device case according to another preferred embodiment of the present invention. The control device case of the second embodiment is a modification to the control device case of the first embodiment shown in FIGS. 1a to 4, and is mainly different in that the covers 25 of the control device case of the preceding embodiment are replaced by a single cover. In particular, the control device case of the present embodiment includes a case body 21 similar to the case body 21 of the control device case shown in FIGS. 1a to 4. The control device case further includes a single cover 26 in the form of a molded plastic article which covers over an entire outer periphery of the case body 21 except an outer face of a rear wall 21D. The cover 26 has a substantially symmetrical structure with respect to a horizontal line which is centered in a vertical direction as seen in FIGS. 5a and 8, and corresponds to covers 25 of the arrangement shown in FIGS. 1a to 4 which are interconnected as a single member by suitable connecting portions. In particular, the cover 26 has a pair of angular holes 26a formed at upper and lower locations thereof such that the terminal blocks 23 at the upper and lower end portions of the printed circuit board 22 may pass therethrough. The cover 26 further has a plurality of angular ventilating holes 26d formed at upper and lower portions of a front wall and top and bottom walls thereof. The cover 26 further has two pairs of hooks 26c formed at rear ends of upper and lower portions of the opposite side walls thereof for engaging with rearmost ones of the outer cooling fins 21a on the opposite side walls 21B and 21C of the case body 26 to hold the cover 26 on the case body 21. The cover 26 additionally has a pair of recessed portions 26e formed on opposite end portions thereof in the axial direction of the pipe, in aligned relationships with the securing holes 21c of the case body 21 as seen in FIG. 5a. The recessed portions 26e are provided in order to facilitate a mounting operation of the control device case which involves placing a fastening member such as a fastening screw through the securing holes 21c.

In assembling the control device case of the second embodiment the cover 26 is moved toward a case body 21, on which a printed circuit board 22 and a semiconductor module 24 are securely mounted, under the guidance of the angular holes 26a thereof and terminal blocks 23 mounted on the printed board 22. This movement is continued until the hooks 26c are snap engaged with the corresponding cooling fins 21a of the case body 21, thereby completing mounting of the cover 26 onto the case body 21. The control device case assembled in this manner may be secured to a wall (not shown) of a room or the like using a screw or some other suitable means making use of the hole 21c formed in the rear wall 21D of the case body 21.

Also with the control device case of the second embodiment the case body 21 is produced similarly by obliquely cutting an extrusion molded angular pipe material of aluminum, and the control device case exhibits similar effects to those of the control device case shown in FIGS. 1a to 4. A peculiar characteristic to the modified control device case, however, is that, in order to prevent an operator from inadvertently touching and being burnt by the case body 21, which is made of an aluminum material and is heated to a high temperature due to generation of heat from the semiconductor module 24, the cover 26, which is made of molded plastic and is thus a thermal insulator, is provided over the entire outer periphery of the case body 21 except the outer face of the rear wall 21D.

A plurality of ventilating holes 26d are formed on upper and lower portions of the front wall and the top and bottom walls of the cover 26 in locations corresponding to the cooling fins 21a to allow cooling air to pass therethrough and cool the fins 21a of the case body 21. The rise in the temperature of the case body 21 and hence of the heat generating members such as the semiconductor module 24 can thereby be restrained to a temperature lower than a predetermined level due to movement of air through the spacing between the case body 21 and the cover 26, which movement is caused by natural convections of cooling air.

Further, since the molded plastic cover 26 is provided over the entire case body 21 except the outer face of the rear wall 21D, a possible danger is eliminated which may arise from the fact that the edges of the obliquely cut faces of the case body 21 make acute angles. Further, since the opposite ends of the case body 21 are cut obliquely, the printed circuit board 22 can be secured readily to the case body 21 and a wiring operation to the terminal blocks 23 can be performed readily with safety without removing the cover 26 by way of the angular holes 26a of the cover 26.

While the case body 21 in the first and second embodiments of the present invention is described as being an extrusion molded article of aluminum similar effects can be obtained even where it is produced as a die-cast article of aluminum.

Further, while the terminal block 23 is described as provided at two upper and lower locations of the printed circuit board 22 in the embodiments described above, even if it is provided at only one of the locations similar effects may be obtained by eliminating one of the angular holes 25a or 26a of the covers 25 or cover 26 or by using another cover if the angle of an obliquely cut end of the case body 21 is changed.

Figure 11:
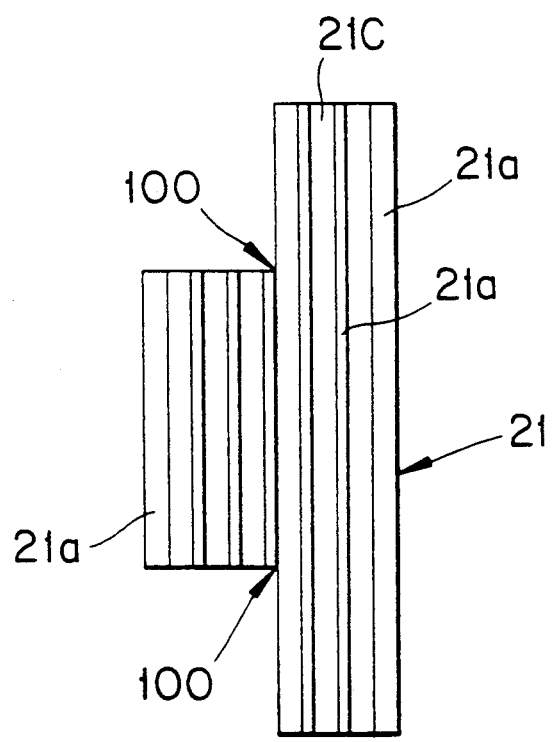
FIG. 11 is a side view of a case body according to a third embodiment of the present invention.

Further, while the case body 21 in the first and second embodiments of the present invention has end faces which are inclined such that the front wall thereof may be shorter in the direction of the pipe axis than the rear wall thereof, such inclined end faces are not necessarily required, but only such structure is required wherein members such as a terminal block or a variable resistor provided on a printed circuit board which require manual operation for the wiring or adjustment thereof can be exposed without provision of a lid or a door on the front wall side of a case body. Thus, similar effects can be attained, for example, even with a stepped structure, such as is shown generally at 100 in FIG. 11, wherein the front side is shorter in the axial direction than the rear side. In this instance, the cover would naturally be structured to allow fitting thereof with the opposite ends of the case body.

Having now fully described the invention, it will be apparent to one of ordinary skill in the art that many changes and modifications can be made thereto without departing from the spirit and scope of the invention as set forth herein.

What is claimed is:

1. A control device case, comprising:
   a case body in the form of a rectangular hollow pipe having a substantially rectangular cross section, said case body having a printed circuit board holding structure formed on an inner periphery thereof for holding a printed circuit board on which an element which may generate heat is mounted, said case body having a plurality of cooling fins formed in an axial direction of said case body on an outer periphery thereof for radiating heat generated from the element on the printing circuit board held on said printed circuit board holding structure of said case body, opposite ends of said case body in said axial direction being formed such that a length of a first wall of said case body is shorter than a length of an opposing second wall of said case body; and
   a pair of covers mounted on opposite end portions of said case body in such a manner as to cover said opposite ends of said case body in said axial direction, each of said covers having an opening formed therein such that a member mounted on the printed circuit board may be manually operated therethrough.

2. A control device case as claimed in claim 1, wherein each of said covers has a pair of hooks for engaging with a pair of said fins on other opposing walls of said case body.

3. A control device case as claimed in claim 1, wherein each of said covers has a plurality of ventilating holes formed therein.

4. A control device case as claimed in claim 1, wherein said case body has at least one hole formed in said second wall thereof for passing a fastening member such as a fastening screw for securing said case body to a suitable support such as a wall of a room, and at least one of said covers has a recessed portion formed in an aligned relationship with said hole of said case body.

5. A control device case as claimed in claim 1, wherein opposite ends of other opposing walls of said case body are inclined in said axial direction.

6. A control device case as claimed in claim 1, wherein opposite ends of other opposing walls of said case body are stepped in said axial direction.

7. A control device case, comprising:
a case body in the form of a rectangular hollow pipe having a substantially rectangular cross section, said case body having a printed circuit board holding structure formed on an inner periphery thereof for holding a printed circuit board on which an element which may generate heat is mounted, said case body having a plurality of cooling fins formed in an axial direction of said case body on an outer periphery thereof for radiating heat generated from the element on the printing circuit board held on said printed circuit board holding structure of said case body, opposite ends of said case body in said axial direction being formed such that a length of a first wall of said case body is shorter than a length of an opposing second wall of said case body; and
a cover for covering said first wall, other opposing walls, and said opposite ends of said case body, said cover having an opening formed in a front wall thereof such that a member mounted on the printed circuit board may be manually operated therethrough, said cover having a plurality of ventilating holes formed in opposite end portions thereof in said axial direction.

8. A control device case as claimed in claim 7, wherein said cover has two pairs of hooks formed at said opposite end portions thereof in said axial direction for engaging with a pair of said fins on said other opposing walls of said case body.

9. A control device case as claimed in claim 7, wherein said case body has at least one hole formed in said second wall thereof for passing a fastening member such as a fastening screw for securing said case body to a suitable support such as a wall of a room, and said cover has a recessed portion formed in an aligned relationship with said hole of said case body.

10. A control device case as claimed in claim 7, wherein opposite ends of said other opposing walls of said case body are inclined in said axial direction.

11. A control device case as claimed in claim 7, wherein opposite ends of said other opposing walls of said case body are stepped in said axial direction.

* * * * *